United States Patent [19]

Abe

[11] 4,292,063
[45] Sep. 29, 1981

[54] MANUFACTURE OF AN OPTICAL FIBER PREFORM WITH MICRO-WAVE PLASMA ACTIVATED DEPOSITION IN A TUBE

[75] Inventor: Koichi Abe, Ottawa, Canada

[73] Assignee: Northern Telecom Limited, Montreal, Canada

[21] Appl. No.: 146,522

[22] Filed: May 5, 1980

[51] Int. Cl.³ .......................................... C03B 37/075
[52] U.S. Cl. ....................................... 65/3.12; 65/13; 65/18.1; 65/31; 427/39; 427/163
[58] Field of Search ..................... 65/3 A, 31, 13, 18; 427/39, 163; 118/720, 723, 725

[56] References Cited

U.S. PATENT DOCUMENTS

| | | | |
|---|---|---|---|
| 3,655,438 | 4/1972 | Sterling et al. | 427/39 X |
| 4,125,389 | 11/1978 | King | 65/3 A |
| 4,145,458 | 3/1979 | Koenings et al. | 427/39 |
| 4,217,027 | 8/1980 | MacChesney et al. | 65/3 A X |

Primary Examiner—Richard V. Fisher

Attorney, Agent, or Firm—Sidney T. Jelly

[57] ABSTRACT

For making a preform for production of optical fiber, the preform including fused silica, particulate material is deposited on the inside wall of a glass tube while the tube is reciprocated through a microwave cavity for production of a plasma in the tube. Oxygen and a reactant gas containing silica are passed through the tube. Dopant material can be added to the gas mixture and the concentration of the dopant varied to vary the refractive index. After the deposit of a sufficient thickness of particulate material, it is fused. The material can be caused to fuse on to the inner wall of the tube or to shrink away from the inner wall and removed from the tube. When the material is fused onto the wall of the tube it can then be collapsed, then either drawn to a fiber or placed in a further tube and drawn to a fiber. When the fused material shrinks from the tube wall, then it is collapsed to a solid rod, placed in a tube and then drawn to a fiber.

16 Claims, 1 Drawing Figure

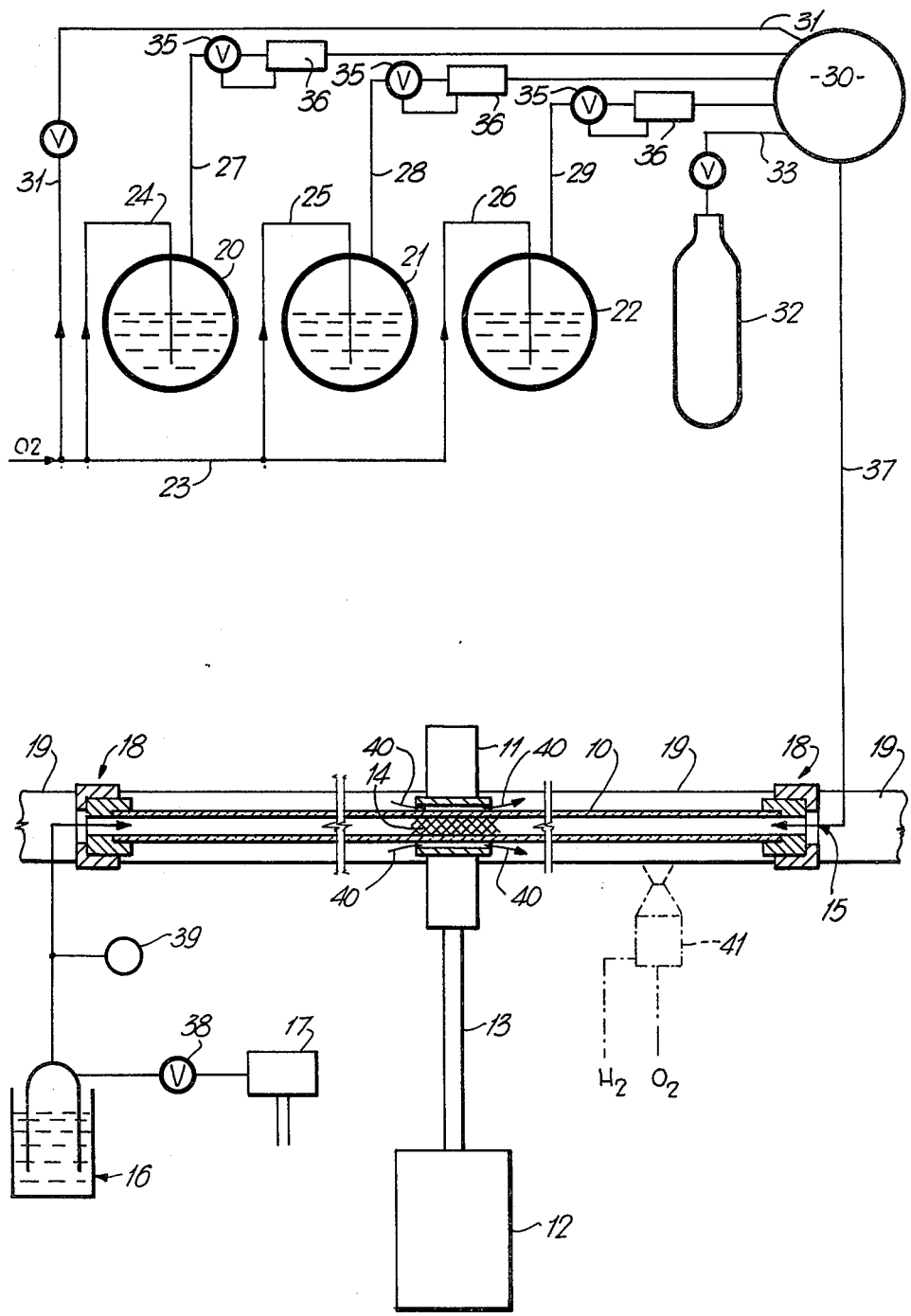

MANUFACTURE OF AN OPTICAL FIBER PREFORM WITH MICRO-WAVE PLASMA ACTIVATED DEPOSITION IN A TUBE

This invention relates to the manufacture of optical fiber preforms, with microwave-plasma activated deposition, and to the manufacture of fibers from such preforms.

Currently several different techniques are known to manufacture silica based (high silica) optical fibers, such as modified chemical vapour deposition (MCVD) or (internal vapour phase oxydation process), high temperature CVD outside vapour phase oxydation (OVPO), vapour phase axial deposition (VAD), microwave plasma activated CVD and radio frequency (RF) plasma activated CVD.

The basic chemical reaction is the same for all those techniques:

$$SiCl_4 + O_2 \rightarrow SiO_2 + 2Cl_2$$

Depending upon the deposition conditions, the form of the product, $SiO_2$, varies continuously from a particulate to a transparent glassy form with an opaque porous form between these. A soot deposit implies the particulate and the opaque porous deposits.

The ideal fiber manufacturing technique should fulfill the following requirements:

(1) High deposition rate.
(2) Precise control of dopants concentrations and their distribution.
(3) Minimum impurity contamination.

Currently none of the above techniques fulfill all of these requirements. The highest deposition rate has been achieved in the OVPO and the VAD techniques. A soot is generated in a hydrogen-oxygen burner (originally called the flame hydrolysis technique) followed by sintering the soot deposit into a glass form. A high level of water contamination is the drawback of these processes. An attempt to deposit the soot in a hydrogen free atmosphere using a RF plasma torch has not been successful to date due to technical difficulties in controlling the dopant concentration and the deposition temperature.

Internal processes such as MCVD and MW plasma CVD have minimum OH contamination. However, the deposition rate is limited by the requirement of the glass form deposition or the simultaneous fusion from the soot to the glass form.

The present invention overcomes most, if not all, of the present disadvantages of the various methods, as related above, and will provide the above related requirements. Broadly, with the present invention, optical fiber preforms are manufactured by passing oxygen and vapours containing one or more additives through a fused silica or other type of glass tube, the tube being reciprocated relative to a plasma forming cavity which creates a plasma discharge inside the tube. Particulate silica (soot) is formed and layers of soot are deposited on the inner wall of the tube. The chemical reaction is initiated by microwave plasma. The layers contain one or more additives, or dopants, and/or flux, and the soot deposit is finally sintered or fused. Sintering is followed by collapsing to a solid preform. The preform may thereafter be drawn to a fiber.

The invention will be readily understood by the following description, in conjunction with the accompanying drawing which is a diagrammatic illustration of one form of apparatus for carrying out a method of the invention.

As shown in the drawing, a glass tube 10, for example of fused silica, is mounted for reciprocal movement, relative to a microwave cavity 11. The cavity is connected to a microwave generator 12 by a waveguide 13 and plasma is generated, in the tube, as indicated at 14. Reactant gases and vapours and oxygen are fed, to the tube, as indicated by arrow 15 and residual gases abstracted from the tube, via a liquid nitrogen trap 16, by pump 17. The microwave generator 12 includes control means, not shown, for controllably varying the power to the plasma to generate desired temperatures in the tube.

Conveniently, the tube is supported in rotatably mounted chucks 18 for reciprocating motion on a carriageway 19. Reciprocation of the tube and chuck assembly can be by any convenient way, for example a threaded lead screw and reversible motor, a pneumatic jack, or a hydraulic jack. Other ways of rotatably and reciprocatably mounting the tube can be used.

In the example, the gases and vapours are provided by bubbling oxygen through one or more liquids. Thus, as seen in the drawing, reservoirs 20, 21 and 22 are provided. Oxygen is supplied, via pipe 23. From the pipe 23, pipes 24, 25 and 26 feed into the reservoirs 20, 21 and 22 respectively. The oxygen bubbles through the liquids and picks up vapours, the oxygen and vapours passing out through pipes 27, 28 and 29, to a collecting chamber 30. Oxygen is fed directly to the collecting chamber 30 via pipe 31 and argon can be added, from cylinder 32 and pipe 33 to assist in maintaining the plasma discharge.

As an example, reservoir 20 contains silicon tetrachloride in liquid form, reservoir 21 contains phosphorous oxychloride in liquid form and reservoir 22 contains germanium tetrachloride in liquid form. It should be appreciated that not all the reservoirs need be provided, or if provided, used. For example, depending on the particular fiber structure desired, only reservoirs 20 and 21 need be used, or provided, for germanium doped silica deposition. For phosphorus as a dopant or other additives, only reservoirs 20 and 22 need be used, or provided. For a preform with germanium doping of the silicon, with phosphorus also added, all three reservoirs are used. Other materials, for example boron, for use as dopants or other additives, can be provided by providing suitable liquids in the reservoirs.

A control valve 35 is provided in each of the pipes 27, 28 and 29, plus a monitor 36 which monitors the amount of dopant or additive in the vapour. The monitors 36 provide signals which are fed back to the valves 35 to control the flow through the pipes and maintain the desired admixture of gas and vapours in the collecting chamber 30. The mixed gases and vapours feed via pipe 37 to the tube 10.

A typical process is as follows. The flow of oxygen to the reservoir 20, and to reservoir 22, for germanium doping, is started and the desired concentrations set at the monitors 36. The pump 17 extracts the gases and vapours to maintain a pressure within the tube at a desired value. A control valve 38 and pressure gauge 39 are provided. A typical range is between 10 and 30 Torr, although up to 200 Torr has been used. Difficulties in maintaining a stable plasma discharge can occur outside this range. To assist in maintaining the plasma discharge, argon can be added. Once the flow rates have settled, the plasma is initiated, the tube 10 rotated and the tube reciprocated through the cavity 11.

Upon striking the plasma, heat is generated within the tube 10. A typical frequency for the generator is 2.45 GHz and the amount of power supplied is controlled to be that sufficient to produce a temperature at the inner surface of the tube below about 500° C. Particulate material, or soot, is formed and deposits on the inner surface of the tube as a result of the dissociation and oxydation reaction initiated by the plasma discharge.

After the desired number of traverses of the tube, and the deposition of the desired number of layers of soot, the soot deposit is sintered or fused. One way of doing this is to heat the tube with a hydrogen-oxygen burner. A burner is indicated in the drawing, in dotted outline at 41. The tube can be traversed, or the burner, while the tube is rotated. The temperature of sintering is about 1500°–1700° C. After sintering the temperature is increased to collapsing temperature to collapse the tube under surface tension to a solid preform, at about 2100° C. Finally, for production of a fiber, the preform can be positioned in a drawing furnace and the fiber drawn.

Compared with the modified chemical vapour deposition (MCVD) process, which is the most usually used process at present, the method of the present invention has various advantages. Thus, the deposition rate is higher because soot thickness per pass is not limited by the simultaneous fusion requirement of the MCVD process. As a corollary, the number of passes per unit of time can be higher. Effectively therefore, a larger volume of deposit can be produced in a given time period. Energy to initiate the chemical reaction is efficiently coupled to the chemicals through the tube wall and the deposited soot layers. Similar soot accumulation is difficult to obtain in the MCVD process because the heat required to initiate the reaction, approximately 1400° C. causes premature sintering which can result in the formation of bubbles in the deposited layers. The index profile is more accurate and consistent because (a) the depletion of the volatile dopants, e.g. germanium and/or phosphorus, at the deposition temperatures used in MCVD process does not occur at the soot deposition temperature of the present invention process and (b) the deposition can consist of many relatively thin layers, giving a better stepwise radial approximation of the ideal profile. The control of the invention process is much easier than that of MCVD, for example temperature control. Because of the low deposition temperature, distortion of the tube 10 is minimal. Thin wall tubes, of fused silica, or less costly tubes such as are sold under the trade name Vycor, can be used to reduce costs.

Compared with the OVPO and MW plasma CVD process, OH contamination is minimal due to the hydrogen free environment and a higher deposition rate is obtainable.

The higher deposition rate occurs because it is possible to form soot faster than it can be fused or sintered. A large advantage of the present invention is that all of the deposit can be formed as a soot, at high deposition rates, and then the much slower fusing or sintering step is carried out on the total deposit. Thus the slower step occurs only once for the production of the preform, instead of controlling the deposition rate of every layer as previously occurred.

With the present invention it is possible to make a much bigger preform starting with a larger diameter substrate tube of thin wall structure, with a large core material deposition. After collapsing to a solid rod, the rod can be inserted into a further tube which is a fairly close fit on the rod. The whole is then put in a drawing furnace and drawn, the outer tube collapsing on to the rod as the fiber is drawn. For example, a preform can be produced which will produce over 10 Km of fiber.

Cooling can be provided to cool the tube 10 and this will permit an increased deposition rate. Cooling can be by air of other gas, passed along the outside of the tube, as indicated by arrows 40.

Some typical parameters or data for producing a germanium doped preform are as follows: flow rate of silicon tetrachloride about 80 cc/min; phosphorus oxychloride flow rate from about 1.5 cc/min to about 15 cc/min; oxygen flow rate about 55 cc/min. The flow rate of germanium tetrachloride is varied, normally at a constant rate, for the whole deposition time, for example from zero to about 10 cc/min, to give a graded index which increases with distance from the inner wall of the tube. The flow rate can also be varied in accordance with a predetermined value to give a non-linear graded index.

The particular flow rates are not critcal or specific to the present invention, being variable as in conventional vapour deposition techniques on an inner surface of the tube.

The deposition is carried out at a temperature below about 500° C., the deposit then being sintered or fused at a temperature between about 1500°–1700° C. These temperatures are not critical.

A specific example of a process, in accordance with the present invention, is as follows:

The substrate tube 10 is mounted at each end and connections made to the supply pipe 37 and exhaust pump 17. The tube is also supported for reciprocal movement through the microwave cavity 11. The tube 10 is first purged, as by passing oxygen and/or argon through the tube. The desired flow rates are then set for oxygen via pipe 31, and for the oxygen bubbling through reservoirs 20, and 21. Once the gas flows have been stabilized, the plasma is struck. Argon may be added via pipe 33. Initially the oxygen flow rate via pipe 31 is at about 55 cc/min; the flow rate of silicon tetrachloride, via pipe 27, at about 80 cc/min; and the flow rate of phosphorus oxychloride about 1.5 cc/min. The flow rate of germanium tetrachloride via pipe 29 is zero at the start of the deposition process. The tube is reciprocated back and forth through the microwave cavity, the temperature within the tube 10 being below 500° C. but above 200° C. for best deposition rate and stable plasma. The flow of germanium tetrachloride is slowly increased, normally at a constant rate, for the whole deposition time, to a maximum of about 10 cc/min, giving a constantly increasing refractive index. The tube is traversed for approximately 1000 complete passes through the cavity building up a deposit thickness of about 300 microns.

The plasma is then shut off and the cavity removed from around the tube. The burner 41 is traversed along the tube slowly while the tube is rotated, the flow of gases and vapours continuing. The burner heats the tube to about 1500° C., at the external surface, and as the burner traverses the deposit on the tube wall fuses.

The length of the deposition time, that is the thickness of the soot deposit, which can be carried out apparently varies with the particular dopant or additive used. Thus, for germanium, it has been found that deposition times of up to about half an hour are satisfactory but at deposition thicknesses produced by longer deposition times, loss of germanium occurs during sintering to the extent that useful levels of germanium doping do not seem to occur. This is not the case with other dopants and additives and therefore the deposition time—thickness of deposit—can be varied in accordance with the particular dopant or additive.

Deposition has been continued for up to about two hours with phosphorus as additive or dopant, while periods of up to half an hour have been used with germanium. Other materials used are silicon tetrafluoride and boron trichloride to provide dopant and/or additives.

A further feature or characteristic of the present invention is the ability to cause the deposited material to shrink away from the support or substrate tube during sintering. By suitable pretreatment of the tube inner surface prior to commencing the deposition, as by a fluorine based, or fluorine containing, etchant the deposit will shrink from the inner surface while without such treatment the deposit can be caused to fuse to the tube inner surface. Thus, at will, it can be obtained that either the deposit fuses to the tube, tube and fused layer being then collapsed to form a preform or the deposit shrinks away from the tube on fusing, the fused layer then being removed from the tube and collapsed to a preform.

In either case, the collapsed preform can be positioned inside a tube of suitable form, for example of fused silica or other glass, the final structure then being capable of being drawn to an optical fiber.

As a further feature it is possible to fuse the deposited material in steps. Thus the deposited soot material can be fused after some predetermined deposition time, deposition continued for a further period and then the further deposited soot material fused. This can be repeated as desired.

What is claimed is:

1. A method of manufacturing an optical fiber preform, comprising:
providing a glass tube;
positioning said tube in a microwave cavity;
feeding a carrier gas through said tube;
applying a microwave field to said cavity to produce a plasma in said tube at a position in said cavity, the power supplied being sufficient to maintain a temperature on the inner wall of said tube below about 500° C.;
feeding a reactant gas containing silica in a vaporous form through said tube;
reciprocating said tube through said cavity for a predetermined plurality of times to build up a deposit of particulate silica on the inner wall of said tube;
heating said tube to provide a temperature on the inner wall of said tube of about 1500° C. to 1700° C.; and
traversing the tube through said cavity to fuse said deposit to form a fused layer of silica.

2. A method as claimed in claim 1, wherein said deposit is fused on to the inner wall of said tube.

3. A method as claimed in claim 1, including the steps of reciprocating said tube through said cavity for a further predetermined plurality of times to build up a further deposit of particulate silica and fusing said further deposit.

4. A method as claimed in claim 3, wherein the steps of building up a deposit of particulate silica and fusing the deposit are repeated a predetermined number of times.

5. A method as claimed in claim 1, including pretreating the inner surface of the tube by an etchant, whereby on fusing the built up deposit of particulate silica, the deposit shrinks away from the inner wall of said tube.

6. A method as claimed in claim 5, the etchant being selected from one of the group consisting of a fluorine based and a fluorine containing etchant.

7. A method as claimed in claim 1, including passing a cooling gas along the outside of said tube.

8. A method as claimed in claim 1, including adding a dopant gas to said reactant gas.

9. A method as claimed in claim 8, including varying the composition of the reactant gas passing through the tube to vary the composition of the deposit in a predetermined manner to give a variation in refractive index.

10. A method as claimed in claim 9, including continuously varying the composition of the reactant gas to give a continuously varying refractive index, the refractive index lower adjacent to the inner wall and increasing in a direction away from said inner wall.

11. A method as claimed in claim 2, including heating said tube and fused deposit to collapse them to a solid rod.

12. A method as claimed in claim 5, including removing the fused deposit from said tube, and heating the fused deposit to collapse it to a solid rod.

13. A method as claimed in claim 11, including inserting the solid rod in a further tube and heating said further tube and rod and drawing to a fiber.

14. A method as claimed in claim 12, including inserting the solid rod in a further tube and heating said further tube and rod and drawing to a fiber.

15. A method as claimed in claim 1, wherein said tube is of fused silica.

16. A method as claimed in claim 13 or 14 wherein said further tube is of fused silica.

* * * * *